(12) United States Patent
Miyano et al.

(10) Patent No.: US 6,926,933 B2
(45) Date of Patent: Aug. 9, 2005

(54) METHOD OF MANUFACTURING WATER-REPELLING FILM

(75) Inventors: Junichi Miyano, Miyazaki (JP); Kiyohiko Toshikawa, Miyazaki (JP); Yoshikazu Motoyama, Mitazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 46 days.

(21) Appl. No.: 10/704,873

(22) Filed: Nov. 12, 2003

(65) Prior Publication Data

US 2005/0089647 A1 Apr. 28, 2005

(30) Foreign Application Priority Data

Nov. 14, 2002 (JP) ........................................ 2002-330415

(51) Int. Cl.7 .............................................. C23C 16/48
(52) U.S. Cl. .................... 427/572; 427/586; 427/255.6; 427/582
(58) Field of Search ................. 427/572, 582, 427/586, 255.6

(56) References Cited

U.S. PATENT DOCUMENTS 6,808,758 B1 * 10/2004 Thakur ..................... 427/559

FOREIGN PATENT DOCUMENTS

| JP | 09043194 A | * | 2/1997 |
|----|------------|---|--------|
| JP | 10-259037  |   | 9/1998 |
| JP | 2002-38094 |   | 2/2002 |

OTHER PUBLICATIONS

JP Title "What is a high polymer material that repels water most" 45,566 1996 Masamichi Morita.

* cited by examiner

*Primary Examiner*—Timothy Meeks
(74) *Attorney, Agent, or Firm*—Takeuchi & Takeuchi

(57) ABSTRACT

A water-repelling film is formed by using a vacuum ultraviolet rays chemical vapor deposition (CVD) system (100) comprising a vacuum ultraviolet rays generating section (102), a reaction room (106), and a window (104) for separating the reaction room (106) and the vacuum ultraviolet rays generating section (102). Plasma having an energy larger than 0 eV but smaller than 10 eV and organic material gas are supplied to the reaction room. A substrate (116) in the reaction room (106) is heated to maintain such a temperature as not causing damage on the substrate (116). Vacuum ultraviolet rays is applied from the vacuum ultraviolet rays generating section (102) to the inside of the reaction room (106) through the window (104).

6 Claims, 3 Drawing Sheets

METHOD OF MANUFACTURING WATER-REPELLING FILM

BACKGROUND OF THE INVENTION

1. Field of the Invention

This invention relates to a method of manufacturing a water-repelling film.

2. Description of the Related Art

As described in Japanese Patent Application Kokai Number 2002-38094, a water-repelling film has generally a contact angle of 140° or greater with respect to water. In Japanese Patent Application Kokai Numbers 2002-38094 and 10-259037, a method of manufacturing a water-repelling film by coating method is disclosed. According to the method, a substrate is coated with a coating liquid and then subject to heat-treatment at high temperature to provide the water-repelling film. The temperature for the heat-treatment is specified as 60° C. to 450° C. in Japanese Patent Application Kokai Number 2002-38094 and 400° C. to 600° C. in Japanese Patent Application Kokai Number 10-259037.

Also, as described in Japanese Patent Application Kokai Number 10-259037, the film is frequently subject to plasma discharge treatment to make the surface of the film rough or uneven so that the surface is activated to improve the function of the water-repelling film. The plasma discharge treatment is performed using plasma having an extremely high energy of several tens eV.

As described in the Non-patent Document Publication Number 45,566, titled "What is a high polymer material that repels water the most?" and written by Masamichi Morita, the contact angle of the water-repelling film depends upon the molecular structure and form of the surface of the water-repelling film. The molecular structure of a compound that forms the surface of the water-repelling film determines the free energy of the surface of the water-repelling film. According to the Non-patent Document, a film having many C—F and C—H bonds in its surface is of superior water repellency because of a low free energy of its surface. Moreover, according to the Non-patent Document, when the surface of the water-repelling film is made rough to have an enlarged surface area, the water repellency is further increased. That is, the water-repelling film is provided by the multiplier effect of the molecular structure and form of the surface of the film.

The water-repelling film can be used as a protection film for a semiconductor device because it repels water. However, if the water-repelling film is formed by the above-described coating method and the plasma discharge treatment, the semiconductor device receives damage. For example, the semiconductor device is damaged by the extension of a diffusion layer caused by high temperature heat-treatment in the coating method and/or charged particles contained in plasma of a high energy in the plasma discharge treatment.

In a Metal Oxide Semiconductor Field Effect Transistor (MOS FET) of a sophisticated semiconductor device of a fine pattern, the gate length is shorter and the diffusion layer, such as a channel is shallower in its depth and narrower in its width. Accordingly, the above-described damage is more critical problems to be solved.

BRIEF SUMMARY OF THE INVENTION

Accordingly, it is an object of this invention to provide a method of manufacturing a water-repelling film under a low temperature without giving any damage on a semiconductor device caused by charged particles in plasma.

According to an aspect of the invention, a water-repelling film is manufactured by using a vacuum ultraviolet rays chemical vapor deposition (CVD) system comprising a vacuum ultraviolet rays generating section, a reaction room having a supporting stand for supporting a substrate, and a window for separating the reaction room and the vacuum ultraviolet rays generating section. The manufacturing method comprises the step of supplying plasma from a plasma generator and organic material gas from a gas supplying section to the reaction room, wherein the plasma has an energy larger than 0 eV but smaller than 10 eV. The method further comprises the steps of keeping heat in the substrate by a heat-retaining section provided in the supporting stand such that the substrate keeps a temperature which does not cause damage on the substrate and applying vacuum ultraviolet rays from the vacuum ultraviolet rays generating section to an inside of the reaction room through the window.

The substrate is not damaged by charged particles in plasma because the plasma supplied into the reaction room has an energy smaller than that of plasma used in the conventional method.

It is assumed that when the vacuum ultraviolet rays are applied to the inside of the reaction room, the material gas is decomposed so that a chemically activated exited active substance is produced. Plasma introduced into the vacuum ultraviolet rays CVD system contains free radical which repeatedly collides with the exited active substance so that the free radical and the exited active substance are re-bonded to create a cluster compound. Consequently, the water-repelling film has an uneven surface which is assumed to be formed by the adhesion of the cluster compound on the surface.

As described above, according to the invention, the water-repelling film can be formed without any damage on the device.

DESCRIPTION OF THE PREFERRED EMBODIMENT

Figure 1:
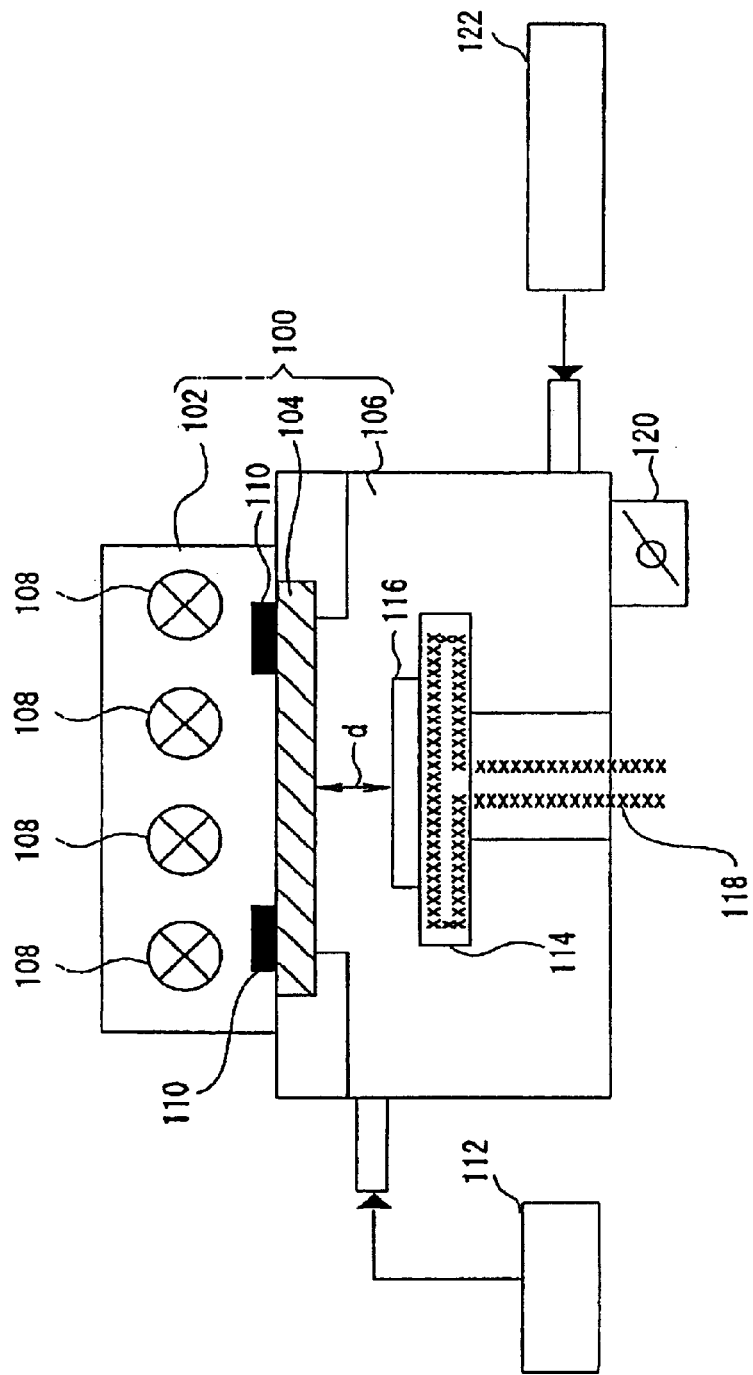
FIG. 1 is a sectional view of a vacuum ultraviolet rays CVD system used in embodiments of this invention.

Embodiments of this invention will be described with reference to the accompanying drawings. The drawings are illustrated in outline to the extent of facilitating understanding of the invention and, therefore, the invention should not be limited to examples shown in the drawings.

In FIG. 1, a vacuum ultraviolet rays CVD system 100 comprises a vacuum ultraviolet rays generating section 102, a reaction room 106, and a window 104 for separating the reaction room 106 and vacuum ultraviolet rays generating section 102.

The reaction room 106A contains a supporting stand 114 for supporting a substrate 116. The supporting stand 114 is provided with a heat-retaining section 118 for keeping the temperature of the substrate 116 constant during the reaction in the reaction room 106 which is described later. The specific structure and an example of the operation of the heat-retaining section 118 will be also described later in detail.

A gas supplying section 112 and a plasma generator 122 are provided either inside or outside the reaction room 106. In FIG. 1, material gas is supplied from the gas supplying section 112 to the reaction room 106 and plasma is input from the plasma generator 122 into the reaction room 106. The supply of the material gas and plasma to the reaction room 106 will be described later in detail.

The vacuum ultraviolet rays generating section 102 is provided with a plurality of excimer lamps 108. It is preferable that a light emitting gas used in the excimer lamps 108 is selected according to the kind of the material gas supplied to the reaction room 106. Bond energies for a plurality of bonds of the material gas are different according to the kind of the material gas because of difference in a compound contained in the material gas. Accordingly, the light emitting gas is selected such that the photon energy of light emitted from the excimer lamps 108 is preferably equal to or grater than the respective bonding energies of the compound.

The window 104 is constructed such that light having a main wavelength of the vacuum ultraviolet rays from the vacuum ultraviolet rays generating section 102 passes through the window 104. The window 104 is provided with heaters 110 to keep the temperature of the window 104 at a predetermined value during the below-described reaction in the reaction room 106. When the temperature of the window 104 is maintained constant, the reaction speed in the reaction room 106 is extremely slow in the vicinity of the window 104. That is, when the temperature of the window 104 is kept constant, the reaction in the reaction room 106 is difficult to take place in the vicinity of the window 104 so that the cloudiness of the window 104 can be prevented because films produced by the reaction are not accumulated in the window 104.

In FIG. 1, the heaters 110 having a shape of ring are provided on the upper side of the window 104, namely on the window 104 outside the reaction room 106. However, the method of installation and shape of the heaters 110 used in this embodiment are not limited to an example illustrated in FIG. 1.

Next, a method of manufacturing the water-repelling film on the substrate 116 using the above-described vacuum ultraviolet rays CVD system 100 will be described according to the embodiment of the invention. In the below-described method, s silicon substrate is used, however, another substrate may be used as the substrate 116.

As described above, the water-repelling film is formed by the multiplier effect of the molecular structure and form of the surface of the film. A water-repelling film according to the embodiment of the invention has an uneven surface having many C—H bonds of a low polarizability. Accordingly, the free energy of the surface of this water-repelling film is low.

Tetramethylsilane ($Si(CH_3)_4$) (TMS), an organic gas having C—H bonds, manufactured by Daido Air Products Electronics Co., Ltd., is used as a material gas which is supplied to the vacuum ultraviolet rays CVD system 100.

As an alternative organic material gas, a compound selected from the group including, for example, $(CH_3)_3SiCl$, $(CH_3)_2SiCl_2$, $CH_3SiCl_3$, $(CH_3)_3SiH$, $(CH_3)_2SiH_2$, $CH_3SiH_3$, $(CH_3)_3SiF$, $(CH_3)_2SiF_2CH_3SiF_3$, and $CH_3SiH_2F$ may be used, wherein a desired number of methyl group (—$CH_3$) out of four methyl groups (—$CH_3$) in the (TMS)($Si(CH_3)_4$) is replaced by a compound in which one or more elements selected from Cl, F, and H are bonded with Si.

The TMS is supplied from the gas supplying section 112 to the reaction room 106, of which inside has been prearranged to have a decreased pressure, or substantially vacuum condition. In this embodiment, the steam of TMS having a steam pressure of 200 mTorr at 25° C. is supplied from the gas supplying section 112. For example, the TMS vaporized by vaporizer may be supplied from the gas supplying section 112 to the reaction room 106.

Nitrogen ($N_2$) gas and Argon (Ar) gas are supplied to the plasma generator 122, ASTRON, manufactured by Applied Science and Technology, Inc., at flows of 0.25 Pa ($m^3$/s) and 0.3 Pa ($m^3$/s), respectively, to create nitrogen plasma and argon plasma in the plasma generator 122. The nitrogen plasma and argon plasma are supplied to the reaction room 106 through a plasma conduit (not shown). It is preferable that the plasma conduit is a pipe made of, for example, aluminum (Al).

When generating the nitrogen plasma in the plasma generator 122, it is usual that the argon plasma has been generated in advance using the supplied argon gas. Then, the nitrogen gas is supplied to the plasma generator 122 to generate the nitrogen plasma. Consequently, plasma, which is supplied from the plasma generator 122 to the reaction room 106, includes both the nitrogen and argon plasma. The energy of the plasma is as low as several eV (larger than zero eV but smaller than ten eV), while the energy of the plasma used in the conventional method is several tens eV.

Other kind of plasma may be used instead of the nitrogen and argon plasma as long as the energy of the plasma is as low as several eV. The alternative plasma may be produced from the rare gas, such as helium (He) and neon (Ne) and supplied to the reaction room 106.

The substrate 116 in the reaction room 106 with presence of the plasma and the material gas is kept warm by the heat-retaining section 118 in the supporting stand 114 to keep such a temperature as causes no damage on the substrate. Then, vacuum ultraviolet rays emitted from the vacuum ultraviolet rays generator 102 are applied to the substrate 116 through the window 104.

A xenon (Xe) excimer lamp, which uses xenon (Xe) as a light emitting gas, is used as the excimer lamp 108 of the vacuum ultraviolet rays generator 102. The theoretical values of the bond energies of the TMS are 3.7 eV for $S_1$—$CH_3$ bond and 4.3 eV for C—H bond. Here, the vacuum ultraviolet rays emitted from the vacuum ultraviolet rays generator 102 composed of the xenon (Xe) excimer lamp 108 has a main wavelength of 172 nm and a photon energy of 7.2 eV. The window 104 is made of synthetic quartz with a thickness of 20 mm and kept warmth by the heater 110 to have a temperature of 90° C.

A high output power lamp is used for the xenon excimer lamp 108 so that the intensity of the illumination directly under the window 104 becomes 40 mW/$cm^2$ to increase the formation speed of the water-repelling film. The measurement of the intensity of the illumination is performed by an illuminometer, UIT-150/VUVS-172 manufactured by Ushio Electric Co., Ltd. A distance d between the surface of the window 106 on the side of the reaction room 106 and the upper surface of the substrate 116 may be determined at any value if it is within the range of 40 mm to 60 mm. Since the decomposition efficiency of the material gas becomes worse when the intensity of the illumination is small or the distance d is large, the parameters of the intensity of the illumination and the distance d are adjusted to the above-mentioned values.

As shown in FIG. 1, the heat-retaining section 118 functions as a chiller too which circulates antifreeze liquid inside the supporting stand 114. By providing such a chiller 118 inside the supporting stand 114, the temperature of the supporting stand 114 is maintained constant so that the substrate 116 is also kept at constant temperature. In this embodiment, the temperature of the substrate 116 is kept at the room temperature (25° C.). The heat-retaining section 118 may be constructed by a well-known method instead of the chiller.

Defining that a formation time of the water-repelling film is equal to an illumination time of light emitted from the vacuum ultraviolet rays generator 102, the water-repelling film was formed on the substrate 116 during the formation time of 15 minutes under a reaction pressure of 4,000 mTorr in the reaction room 106.

Figure 2:
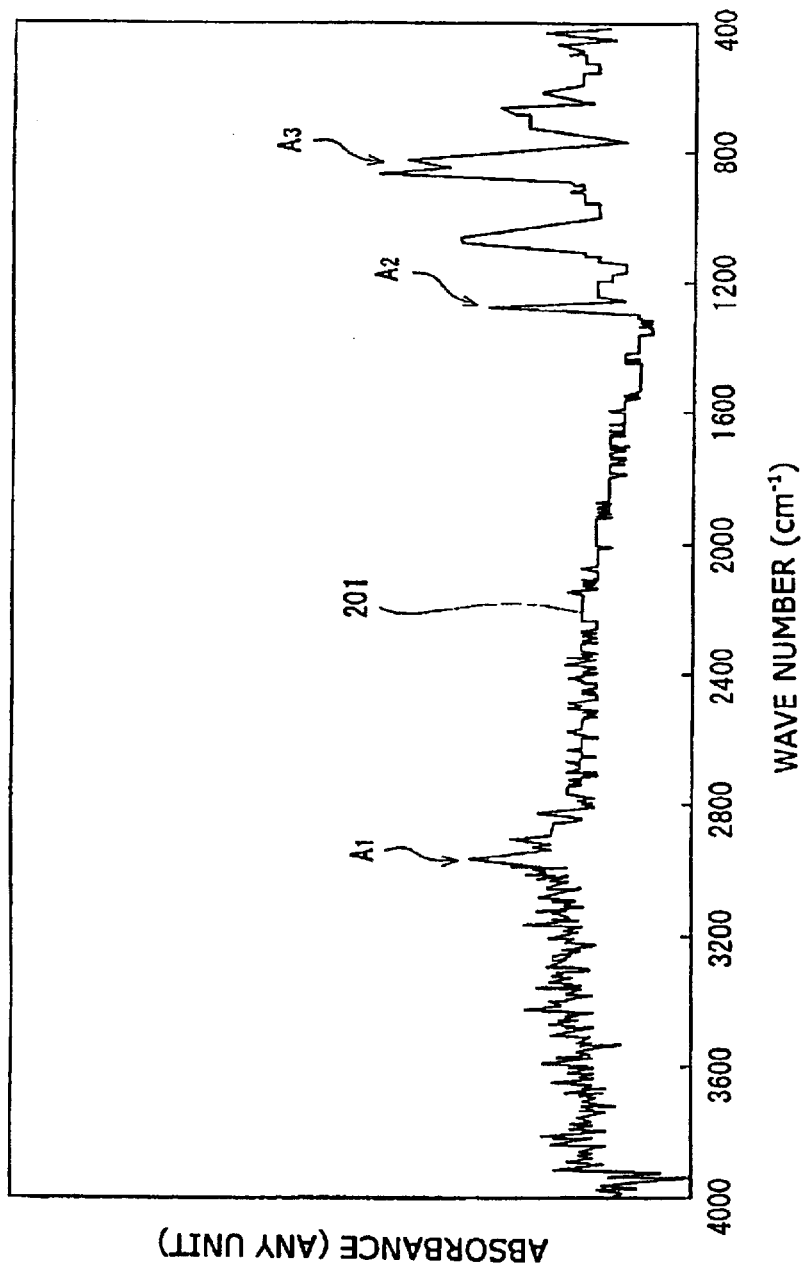
FIG. 2 is a graph of absorbance spectrums of a water-repelling film.

The structure of the water-repelling film formed on the substrate 116 was examined by a Fourier transform infrared spectrophotometer (hereinafter "FT-IR), IR-EPOCH manufactured by Newly Instrument Co., Ltd. In FIG. 2 are shown spectrums 201 obtained by the measurement by the FT-IR, wherein the wave number (cm$^{-1}$) is indicated in the horizontal axis and the absorbance (any unit) is indicated in the vertical axis. The spectrums 201 possess three distinctive absorption characteristics; an absorption characteristic $A_1$ between 2800 cm$^{-1}$ and 3200 cm$^{-1}$, an absorption characteristic $A_2$ in the vicinity of 1200 cm$^{-1}$, and an absorption characteristic $A_3$ having two peaks in the vicinity of 800 cm$^{-1}$. The absorption characteristic $A_1$ indicates the presence of methyl group (—$CH_3$) in the water-repelling film, the absorption characteristic $A_2$ indicates the presence of Si—$CH_3$ bond in the water-repelling film, and the two peaks in the absorption characteristic $A_3$ indicates the presences of Si—H bond and Si—$CH_3$ bond in the water-repelling film. Accordingly, from the spectrums 201 in FIG. 2, it is predicted that the water-repelling film on the substrate 116 has an superior water repellency because the free energy thereof is small due to the presence of C—H bond in the surface of the film.

Then, pure water was dropped on the water-repelling film to measure the contact angle of the dropped pure water with respect to the film. The measurement was performed using CONTACT-ANGLE METER, Model S-150 manufactured by Kyowa Interface Science Co., Ltd. and resulted in the contact angle of 150° or more. The upper limit of the contact angle is varied with the size of the dropped water, however, it is within the range of 160° to 170°. Consequently, it was verified that the water-repelling film on the substrate 116 formed according to this embodiment has an superior water repellency.

In addition, the surface of the water-repelling film was measured by a scanning electron microscope (SEM), Model S4000 manufactured by Hitachi. As comparison, another sample, a water-repelling film having a contact angle of 90° was measured by the same SEM, wherein the comparison sample was formed using the above-described TMS as a material gas and 25 mm as the distance d between the window 104 and the substrate 116.

Figure 3:
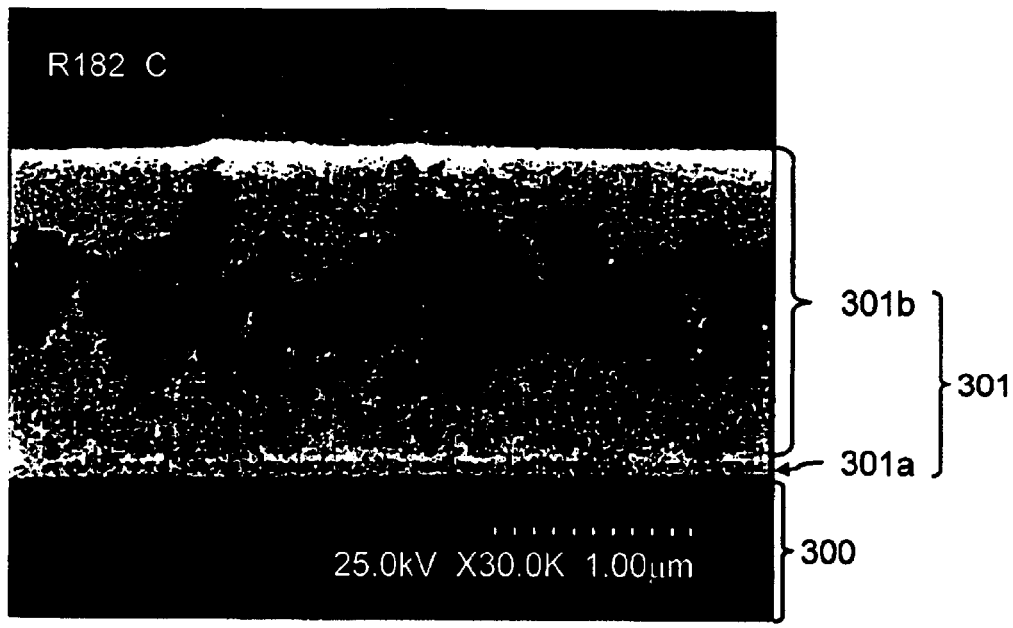
FIG. 3 is a surface form of the first sample which is measured by a SEM.
Figure 4:
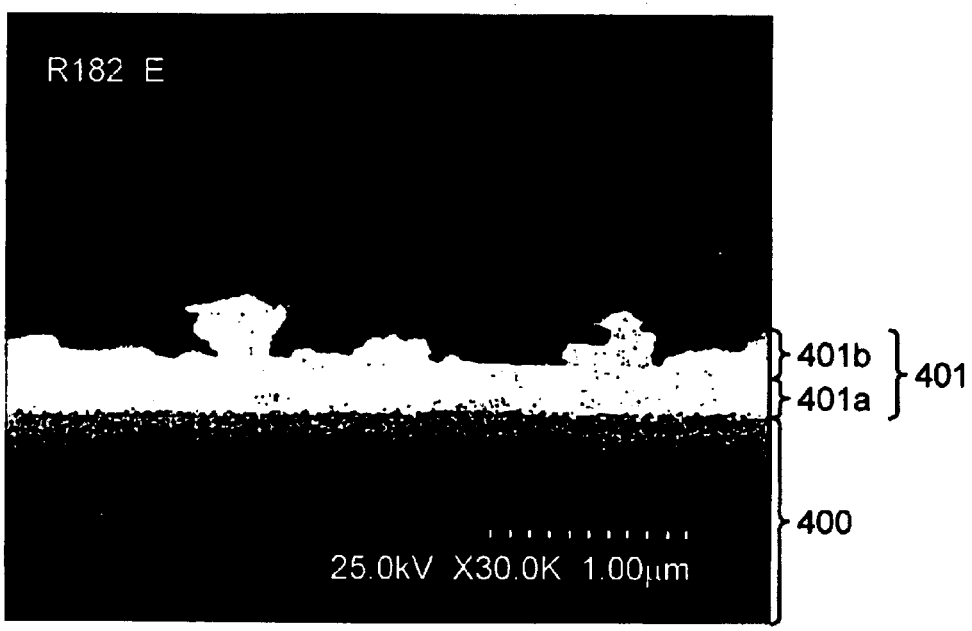
FIG. 4 is a a surface form of the second sample which is measured by the SEM.

FIG. 3 shows the measurement result of the water-repelling film having a contact angle of 150° formed according to the embodiment of the invention (hereinafter "the first sample"), and FIG. 4 shows the measurement result of the water-repelling film of the comparison sample having a contact angle of 90° (hereinafter "the second sample"). Namely, FIG. 3 shows the measurement result by the SEM in a cross section of the film of the first sample, and FIG. 4 shows the measurement result by SEM in a cross section of the film of the second sample at a position corresponding to the position of the cross section of the first sample.

In FIG. 3, a reference numeral 300 indicates the substrate 116. It is seen that a water-repelling film 301 of the first sample, composed of a first layer 301a and a second layer 301b on the first layer 301a, is formed on the substrate 300. In FIG. 4, a reference numeral 400 indicates the substrate 116. It is seen thta a water-repelling film 401 of the second sample, composed of a third layer 401a and a fourth layer 401b on the third layer 401a, is formed on the substrate 300.

The first layer 301a in FIG. 3 and the third layer 401a in FIG. 4 are flat planes of the water-repelling films formed on the substrate 116. The second layer 301b in FIG. 3 and the fourth layer 401b in FIG. 4 are uneven planes with projections formed on the flat planes. It is assumed that the projections are a cluster compound which is formed by the following mechanism.

As described above, when the vacuum ultraviolet rays having a main wavelength of 172 nm and a photon energy of 7.2 eV are applied to the reaction room 106 through the window 104 from the vacuum ultraviolet rays generating section 102, the TMS supplied to the reaction room 106 is assumed to be decomposed. When a chemically activated exited active substance is produced by the decomposition of the TMS, gaseous phase reaction is caused by the exited active substance. In the reaction, a film having C—H bond produced from the TMS is formed on the substrate 116.

The plasma introduced into the vacuum ultraviolet rays CVD system 100 contains free radicals. In the reaction room 106, when the free radicals in the plasma, a kind of exited active substance, and the exited active substance produced by the decomposition of the TMS have repeated collisions against each other, it is presumed that these two exited active substances are re-bonded to form the cluster compound.

It can be seen that the second layer 301b of the first sample has more projections than the fourth layer 401b of the second sample. In FIG. 3, the surface of the water-repelling film of the first sample has an uneven form based upon the forms of the projections formed in the second layer 301b.

As already described, the water-repelling films of the first and second samples were formed with different distances d between the window 104 and the substrate 116. The surface of the water-repelling film of the first sample has many projections and is extremely uneven. Accordingly, it is preferable that the water-repelling film is formed, setting the distance d at a desirable value in the range of 40 mm to 60 mm. That is because it is assumed that the formation of the cluster compound in the reaction room 106 takes place most actively in the range of 40 mm to 60 mm from the surface of the window 104 on the side of the reaction room 106 toward the substrate 116. Accordingly, the substrate 116 is preferably disposed at the place in the reaction room 104 where the formation of the cluster compound is performed most actively.

The surface of the water-repelling film of the first sample has a molecular structure which includes many C—H bond and a form which is extremely uneven. The water-repelling film of the first sample is superior in the water repellency by the multiplier effect of the molecular structure and form of the surface thereof. The water-repelling film of the first sample is composed of a flat film (plane) having a thickness of approximately 1,000 Å and an uneven film (plane) formed on the flat film and including projections having a thickness of approximately 10,000 Å.

As fully described, according to the embodiment, the water-repelling film can be formed without causing any damage on the device because the film is formed under the room temperature (25° C.) using plasma having an energy smaller than that of plasma used in the conventional method.

Here, the temperature of the substrate 116 or the reaction temperature in the reaction room 106 is not limited to the room temperature. In 11$^{th}$ paragraph of Japanese Patent Application Kokai Number 2001-274156, the relationship between the reaction temperature and the film generating speed in the vacuum ultraviolet rays CVD system is described. According to the reference, the higher the reaction temperature is, the smaller the film generating speed is. It is assumed from the above description that the reaction temperature in the reaction room 106 or the temperature of the substrate 116 may be as low as any temperature in the range of the room temperature (25° C.) to 100° C. With the temperature in the range, it is assumed that the reaction speed in the vacuum ultraviolet rays CVD system 100 is not affected exceedingly.

In this embodiment, the reaction room 106 is provided with an exhaust section 120 composed of a predetermined exhausting means so that the exhaust from the reaction room 106 is performed through the exhaust section 120.

The water-repelling film manufactured by the method of this invention has characteristics for a protection film. Accordingly, this invention is applicable for manufacturing the protection film of a semiconductor device and also for manufacturing the protection film of a display panel which can not use high temperature process. An application example of this invention will be described below.

A generally used liquid crystal display (LCD) and organic electroluminescent (EL) element comprise a sealed board composed of a glass board. Accordingly, a panel using these LCD or organic EL element cannot be folded. Also, the heat-resistant temperature of the generally used organic EL element is 80° C.

Therefore, if the sealed board is regarded as a sealed film manufactured by this invention, it is possible to provide a light and thin LCD and organic EL element. That is, this invention is applicable for the manufacture of a panel called a flexibility display.

As fully described, in the method of manufacturing the water-repelling film according to this invention, the reaction temperature or the temperature of the substrate is controlled to the range which does not cause damage on the substrate and plasma has an energy smaller than that of plasma used in the conventional method. Consequently, the water-repelling film can be formed without damage on the substrate or device caused by a high temperature of the substrate or charged particles in plasma.

What is claimed is:

1. A method of manufacturing a water-repelling film using a vacuum ultraviolet rays chemical vapor deposition (CVD) system comprising a vacuum ultraviolet rays generating section, a reaction room having a supporting stand for supporting a substrate, and a window for separating said reaction room and said vacuum ultraviolet rays generating section, said method comprising the steps of:

supplying plasma from a plasma generator and organic material gas from a gas supplying section to said reaction room, said plasma having an energy larger than 0 eV but smaller than 10 eV;

keeping heat in said substrate by a heat-retaining section provided in said supporting stand such that said substrate keeps a temperature which does not cause any damage on said substrate; and applying vacuum ultraviolet rays from said vacuum ultraviolet rays generating section to an inside of said reaction room through said window.

2. The method according to claim 1, wherein said substrate keeps said temperature of as low as any temperature in a range of 25° C. (room temperature) to 100° C. during said step of keeping heat in said substrate by said heat-retaining section.

3. The method according to claim 2, wherein said organic material gas contains C—H bond therein.

4. The method according to claim 2, wherein a distance between a surface of said window on a side of said reaction room and said substrate is within a range of 40 mm to 60 mm.

5. The method according to claim 1, wherein said organic material gas contains C—H bond therein.

6. The method according to claim 1, wherein a distance between a surface of said window on a side of said reaction room and said substrate is within a range of 40 mm to 60 mm.

* * * * *